United States Patent [19]

Mooney et al.

[11] Patent Number: 5,105,055
[45] Date of Patent: Apr. 14, 1992

[54] TUNNELLED MULTICONDUCTOR SYSTEM AND METHOD

[75] Inventors: William C. Mooney, Carp, Canada; Joseph R. Santandreu, Norfolk, Mass.; Kristopher Kshonze, Ottawa, Canada

[73] Assignee: Digital Equipment Corporation, Maynard, Mass.

[21] Appl. No.: 598,948

[22] Filed: Oct. 17, 1990

[51] Int. Cl.$^5$ .............................................. H01B 7/08
[52] U.S. Cl. ........................................ 174/27; 174/24; 174/117 FF; 333/238; 361/408; 439/497
[58] Field of Search ............ 174/24, 27, 117 R, 117 F, 174/117 FF, 268; 333/238; 361/407, 408; 439/497, 494, 492

[56] References Cited

U.S. PATENT DOCUMENTS

| | | | |
|---|---|---|---|
| 1,856,109 | 5/1932 | Murray | 174/27 |
| 1,978,418 | 10/1934 | Dudley | 174/27 |
| 2,800,634 | 7/1957 | Grieg et al. | 333/238 |
| 2,997,521 | 8/1961 | Dahlgren | 439/492 X |
| 3,225,351 | 12/1965 | Chatelain et al. | 343/731 |
| 3,663,739 | 5/1972 | Chevrier | 174/36 |
| 3,904,997 | 9/1975 | Stinehelfer, Sr. | 333/116 |
| 3,928,714 | 12/1975 | Matchett | 174/27 |
| 4,379,307 | 4/1983 | Soclof | 333/238 X |
| 4,383,227 | 5/1983 | deRonde | 333/238 X |
| 4,619,487 | 10/1986 | Brush Jr. | 439/497 X |
| 4,641,140 | 2/1987 | Heckaman et al. | 333/236 X |
| 4,695,810 | 9/1987 | Heckaman et al. | 333/243 X |
| 4,710,253 | 12/1987 | Soszek | 156/272.8 |
| 4,954,095 | 9/1990 | Cogan | 439/284 |

FOREIGN PATENT DOCUMENTS 1255810  6/1989  Canada .

OTHER PUBLICATIONS

Buntschuh, "A Study of the Transmission Line Properties of Trapped Inverted Microstrip Line", Prepared by Rome Air Development Center, Dec. 1974.
Spielman, "Dissipation Loss Effects in Isolated and Coupled Transmission Lines", IEEE Transactions on Microwave Theory and Techniques, vol. MTT-25 No. 8, Aug. 1977, 648-655.
Koul, "Passive Components in Inverted Microstrip and Suspended Microstrip Configurations", IEEE MTT-S Digest, 1983, 412-414.
Tomar, et al., "Effects of Manufacturing Tolerances on the Electrical Performance of Suspended and Inverted Microstrip Lines", International Journal of Infrared and Multimeter Waves, vol. 6, No. 9, 1985, 807-829.
Pramanick et al., "Analysis and Synthesis of Suspended and Inverted Microstrip Lines", AEU, BAND 39 [1985], HEFT 5, 323-326.
Tomar et al., "New Quasi-Static Models for the Computer-Aided Design of Suspended and Inverted Microstrip Lines", IEEE Transactions on Microwave Theory and Techniques, vol. MTT-35, No. 4, Apr. 1987, 453-457.
Bera et al., "Trapped Inverted Microstrip (TIM) Circuits for Combining the Outputs of High-Power IMPATT Oscillators", 306-308.

*Primary Examiner*—Morris H. Nimmo
*Attorney, Agent, or Firm*—Finnegan, Henderson, Farabow, Garrett, and Dunner

[57] ABSTRACT

A tunnel multiconnect system comprising a substrate of flexible dielectric material, a plurality of at least three first line conductors supported on the substrate to form a multiconductor pattern, a second conductor shaped to form a ground plane, a structure for mechanically positioning the second conductor in spaced relation to the multiconductor pattern to form a tunnel therebetween, and connectors located at each end of the first conductors for coupling the first conductors and the ground plane to respective multiport terminals of electrical subassemblies thereby forming a flexible high speed ribbon interconnect system.

15 Claims, 7 Drawing Sheets

TUNNELLED MULTICONDUCTOR SYSTEM AND METHOD

BACKGROUND OF THE INVENTION

I. Field of the Invention

The present invention relates to a multiconductor system for connecting a multiport terminal of one electrical subassembly to a multiport terminal of another electrical subassembly.

II. Background Information

Computer systems comprise a plurality of electrical subassemblies which have multiport terminals that need to be interconnected. On a macroscopic scale, such electrical subassemblies may include central processing units (CPUs), printers, displays, memory devices, modems and the like. Each subassembly has a multiport terminal which must be connected to a corresponding multiport terminal on another subassembly. For example, in FIG. 1 a CPU 10 is shown interconnected to a memory unit 12 by a multiconductor system 14. CPU 10 has a multiport terminal 16 while memory unit 12 has a corresponding multiport terminal 18. Multiconductor system 14 comprises a ribbon cable 20 and a conventional pin connector 22 and 24 located on each end thereof. As is well known to those skilled in the art, connector 22 couples to multiport terminal 16 of CPU 10 and connector 24 couples to multiport terminal 18 of memory unit 12.

A cross-sectional view of ribbon cable 20 is shown in FIG. 2. As may be seen in FIG. 2, ribbon cable 20 comprises a reference plane 26, a plurality of conductors 28 and a dielectric material 30, such as non-reinforced plastic, which operates to hold conductors 28 in spaced relation to ground plane 26 while allowing a degree of mechanical flexibility in the resultant multiconductor system 14.

The state of the art for electrical subassemblies has continued to develop, with the resultant speed of operation of such subassemblies today approaching the microwave (subnanosecond) region of operation. However, although there has been a regular and progressive improvement in the operational characteristics of the electronic subassemblies, there has been a notable lack of development in the multiconductor systems used to interconnect the electrical subassemblies.

As a general principle, air-dielectric structures have been known since the time of Hertz and Marconi. For example, U.S. Pat. No. 1,978,418 issued to Dudley discloses the use of a plurality of air dielectric cables concentrically configured in a multiconductor structure. Air or other gas is employed as an effective dielectric in a space between a central coaxial conductor and a corresponding outer cylindrical conducting shell. The coaxial conductor and outer shell are spaced from each other by use of a spiral ribbon insulator. This structure is not readily adaptable to interconnecting multiport terminals.

More recently, radio frequency transmission waveguides have been developed using air as a dielectric material. One such example may be found in U.S. Pat. No. 2,800,634 issued to Grieg et al. In Grieg et al., a single line conductor is supported on the face of a dielectric strip disposed in spaced parallel relation to a corresponding ground conductor. The dielectric strip is in turn supported by beads or narrow strips of dielectric located laterally of the line conductor. Manufacturing techniques for this type of waveguide include cutting and die stamping operations for short lengths and extrusion techniques for longer lengths. The dielectric is identified as being polystyrene, polyethylene, polytetrafluoroethylene or other flexible insulation of high dielectric quality. The conductive material is identified as being in the form of conductive paint or ink, or other chemically deposited or sprayed conductive material. The purpose of such structure is to provide a low loss transmission waveguide for use at ultra high frequencies. By this system, radio frequency waves are reportedly easily propagated in a mode closely simulating the TEM mode along the line-ground conductor system. There has been no known attempt to employ such a structure as a multiconductor interconnect system.

On a microscopic scale transmission lines are known to be separated from ground planes by an air dielectric on integrated circuit chips, as evidenced by U.S. Pat. No. 4,379,307 issued to Soclof. In this arrangement a V-shaped groove is etched into the surface of a silicon substrate and a series of silicon supporting webs are used to support an aluminum beam in spaced relationship to the surface of the groove, which is itself covered by a conductive coating. As a consequence, an air dielectric is present between the beam and the coating. However, the manufacturing process involved is not applicable to commercially feasible multiconductor interconnect systems.

It is, accordingly, an object of the present invention to provide a very high speed, low loss, multiconductor interconnect system which is applicable to interconnect multiport electrical subassemblies of a computer system and is capable of being mass produced.

Additional objects and advantages of the invention will be set forth in the description which follows, and in part will be obvious from the description, or may be learned by practice of the invention.

SUMMARY OF THE INVENTION

To achieve the foregoing objects, and in accordance with the purposes of the invention as embodied and broadly described herein, a tunnelled multiconductor system for connecting a multiport terminal of one electrical subassembly to a multiport terminal of another electrical subassembly is provided which comprises: a substrate of dielectric material; N first conductors, with N greater than two, supported by the substrate to form a multiconductor pattern; a second conductor shaped to act as a ground plane for the multiconductor pattern; means for positioning the second conductor in spaced relation to the multiconductor pattern to form at least one tunnel which may be gas filled between the second conductor and the first conductors, and wherein the second conductor forms a reference plane for the first conductors; and means, located at each end of the first conductors, for coupling the first conductors and the second conductor to respective multiport terminals of the electrical subassemblies.

Preferably the substrate is formed of flexible extruded dielectric material, the means for positioning is formed of flexible extruded dielectric material and is snapped together with the substrate, the resultant void tunnel is filled with air, and both the first conductors and the second conductor lie inside the tunnel in direct exposure to the air in the tunnel.

A preferred embodiment of the invention includes a method of manufacturing a flexible multiconductor interconnect system comprising the steps of co-extruding an elongated base of flexible first dielectric material and a plurality of strips of flexible second dielectric material located parallel one another in a surface of the first dielectric material to form a continuous pattern longitudinally along the base, the first dielectric material being not receptive to metallic plating and the second dielectric material being receptive to metallic plating; co-extruding an elongated cover of the first dielectric material and a strip of the second dielectric material in a surface of the first dielectric material sized to cover the pattern; the co-extruding of the base and the cover including forming supports therein to position the strips of the base from the strips of the cover in spaced relation to from a tunnel structure between the strips of the base and the strip of the cover which is void of the first and second dielectric materials when the cover is mounted on the base; plating the strips of the base and the strip of the cover with corresponding conductive layers to form a plurality of line conductors in the base commensurate with the pattern and a continuous conductor in the cover; and mounting the cover to the base with the continuous conductor forming a reference plane for the line conductors.

DESCRIPTION OF THE PREFERRED EMBODIMENT

Reference will now be made in detail to the present preferred embodiment of the invention as illustrated in the accompanying drawings.

Figure 2:
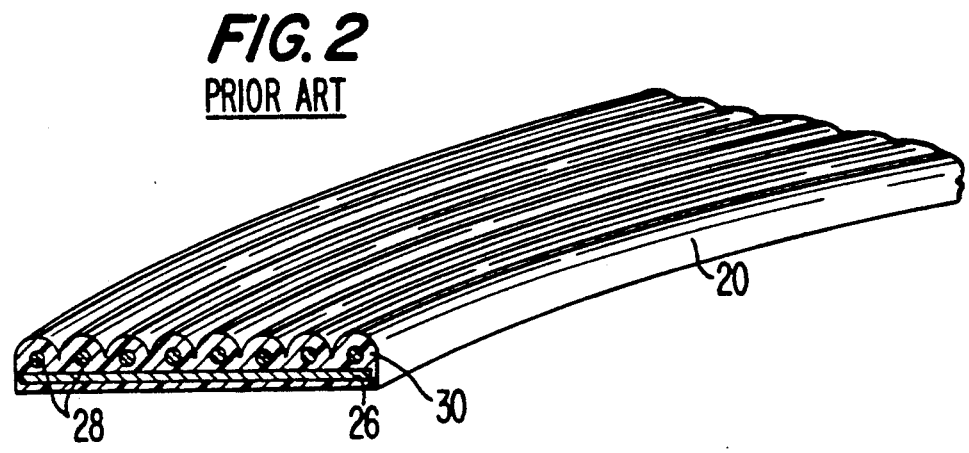
FIG. 2 is a cross-sectional view of the ribbon cable illustrated in FIG. 1.
Figure 3:
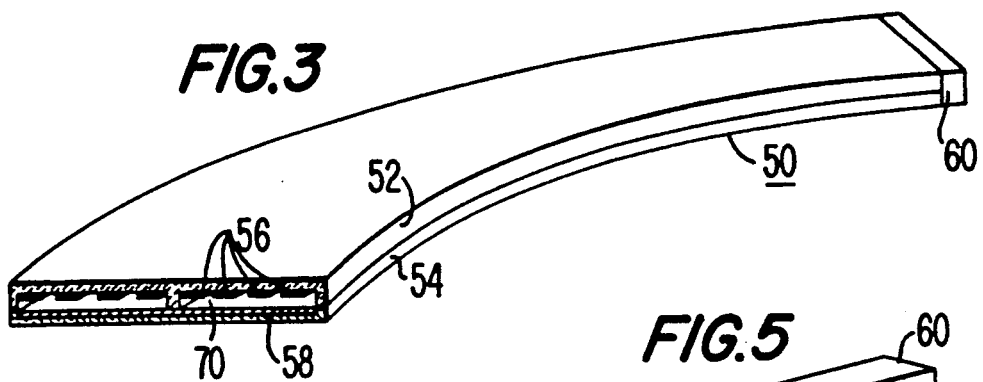
FIG. 3 is a diagram of a section of a ribbon cable incorporating the teachings of the subject invention.
Figure 4:
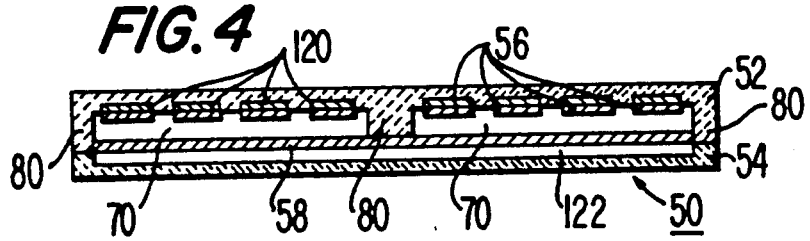
FIG. 4 is a cross-sectional diagram of the ribbon cable of FIG. 3.

In FIGS. 3 and 4 there is illustrated a ribbon cable 50 which comprises a substrate or base 52, a cover 54, a plurality of first conductors 56, a second conductor 58, and connector 60. Substrate 52 and cover 54 preferably comprise material with a low dielectric constant, such as non-reinforced plastic. Base 52 and cover 54 may be formed, for example, by conventional molding techniques or, preferably, by an extrusion technique such as the one set forth in detail below. Substrate 52 and cover 54 may comprise the same type insulative material that is typically used in conventional ribbon cables such as ribbon cable 20 illustrated in FIG. 2.

N first conductors 56 are supported by substrate 52 to form a multiconductor pattern. Consistent with the objective of interconnecting multiport terminals of electrical subassemblies, N is greater than 2 and preferably at least 8. N may, for example, be on the order of 24, 128, or even higher, depending upon the number of ports for each electrical subassembly. A corresponding second conductor 58, which is shaped to act as a ground plane by convering the resultant multiconductor pattern formed by first conductors 56, is located on cover 54 as shown in FIGS. 3 and 4.

Conductors 56 may, for example, comprise copper ribbons, conductive ink, a plated conductor, inserted molded wire, metallization on the lower floor of substrate 52, or the like. In addition conductors 56 may comprise uninsulated embedded wires. Second conductor 58 may comprise, for example, meshed copper or solid copper. Second conductor 58 may be held on cover 54 by either adhesive or laminate bonding, by mechanical methods such as the use of screws or clamps, or by hermetic sealing onto the surface of cover 54.

Figure 1:
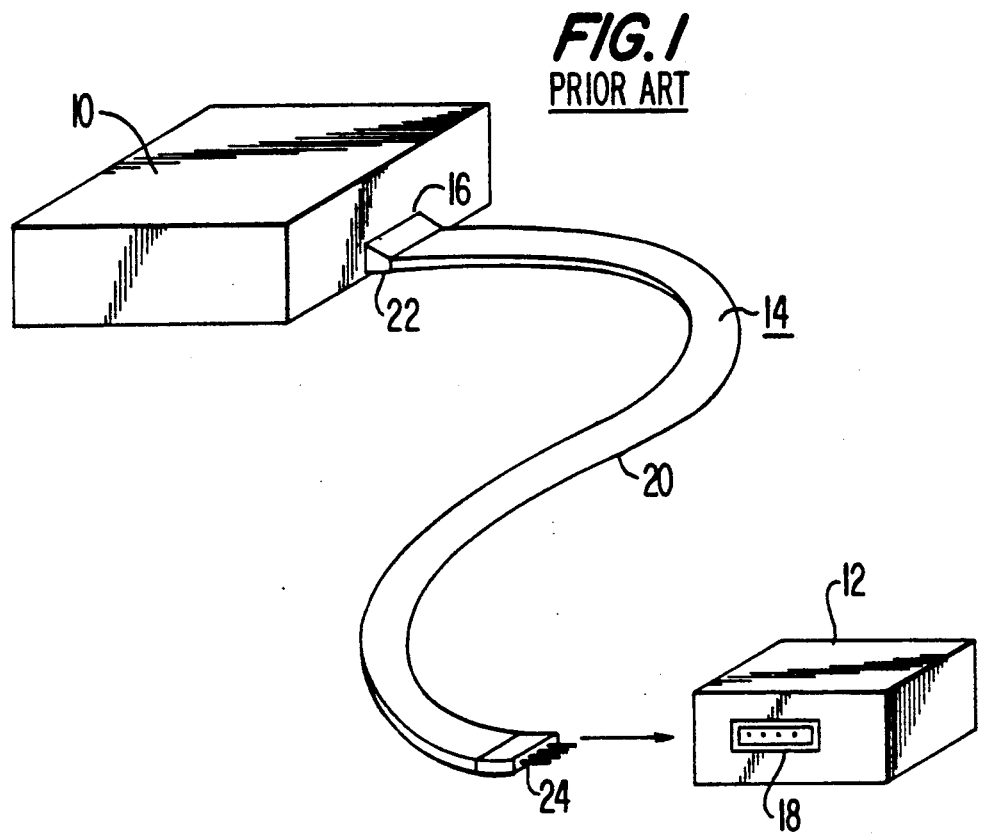
FIG. 1 is a diagram of a conventional ribbon cable multiconductor system connecting a multiport terminal of one electrical subassembly to a multiport terminal of another electrical subassembly.
Figure 5:
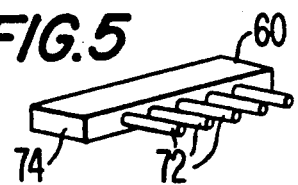
FIG. 5 is a diagram of a connector for use at the ends of the ribbon cable of FIG. 3.

Second conductor 58 is shown in FIGS. 3 and 4 positioned in spaced relation to the multiconductor pattern formed by first conductors 56 to form a tunnel 70 between second conductor 58 and first conductors 56 which may be gas filled. Tunnel 70 is preferably filled with air or some form of inert gas. A connector 60, preferably of a conventional pin type as shown in FIG. 5, is mechanically connected to each end of ribbon cable 50. Individual pins 72 are electrically connected to corresponding first conductors 56, while an outside conductive cover 74 of connector 60 is electrically connected to second conductor 58. As a consequence, ribbon cable 50 with a connector 60 at each end can substitute for the prior art multiconductor system 14 of FIG. 1 which comprises a conventional ribbon cable 20 in the form shown in FIG. 2. However, whereas plastic with a dielectric constant on the order of 3 to 4 is interposed between ground plane 26 and conductors 28 in the prior art arrangement of FIG. 2, air with a dielectric constant of approximately 1 is interposed between conductors 56 and conductor 58 in the embodiments of FIGS. 3 and 4. As a consequence, ribbon cable 50 provides a low loss, multiconductor interconnect system which at computer speeds that approach the sub-nanosecond range, provides a very high speed transmission path.

In the embodiment shown in FIGS. 3 and 4, conductors 56 are separated from conductor 58 by means of sidewalls 80 which are physically attached to substrate 52. Sidewalls 80 in effect form channels or grooves in which conductors 56 are located. The depth and widths of these grooves, and the dimensions of sidewalls 80 which establish the distance between conductors 56 and conductor 58, may be manipulated to optimize electrical characteristics such as impedance, crosstalk and signal propagation speed. For example, for a 50 ohm line impedance, conductors 56 may have a width of 12 mils and a thickness of 1.4 mils. Tunnels 70 may have a separation of 4 mils between opposing surfaces of conductors 56 and 58 with substrate 52 and cover 54 having a dielectric constant of about 4. With this arrangement, conductors 56 may be spaced 12 mils from each other to produce high, yet tolerable crosstalk with 250 pico second rise time signals.

Spacers 80 must be sufficiently close together in order to prevent sagging of substrate 52 or cover 54. In a ribbon cable of typical size, the maximum spacing between sidewalls 80 is suggested to be not greater than one inch. Obviously, the specific spacing depends upon the rigidity of the dielectric material comprising base 52 and cover 54, and the requisite tolerance in the spacing distances between conductors 56 and conductor 58.

Figure 7:
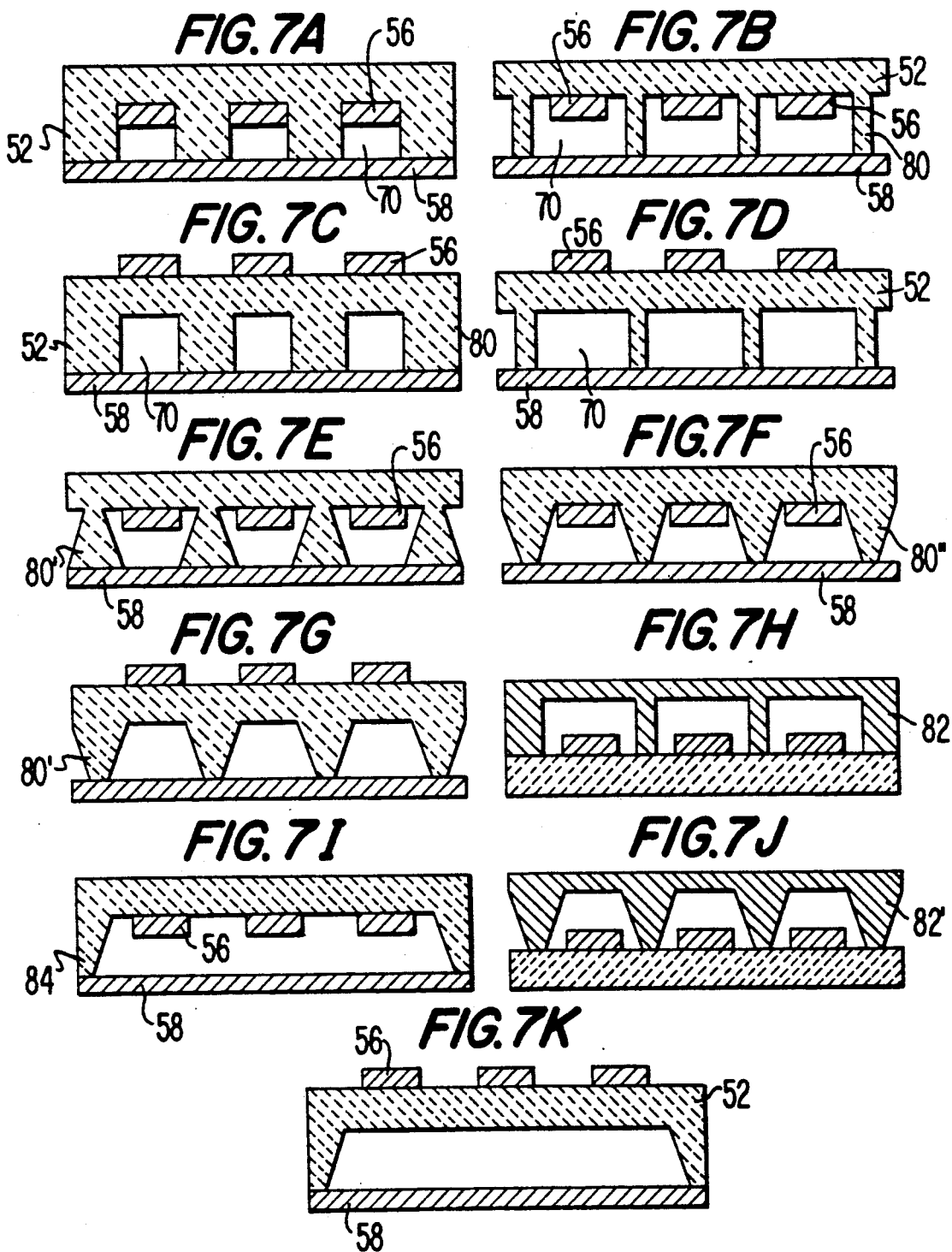
FIGS. 7A-7K are cross-sectional illustrations of alternative embodiments of the ribbon cable of FIG. 3.

As noted above, at least three conductors 56 are employed in ribbon cable 50. In the embodiment shown in FIGS. 3 and 4, four conductors 56 are associated with each tunnel 70 and two separate tunnels 70 are shown positioned side-by-side in ribbon cable 50. In alternative embodiments, the N conductors 56 may be each positioned in their own tunnel 70 as is, for example, shown in the configuration of FIG. 7A. The width of each tunnel 70 may, in such instance, be approximately the same as the width of each conductor 56 as shown in FIG. 7A, or may be greater as shown in the embodiment of FIG. 7B. Both the embodiments of FIG. 7A and FIG. 7B employ conductor 58 to close tunnel 70, without the use of a separate cover as represented by cover 54 in the embodiments of FIGS. 3 and 4. However, it is to be understood that a cover of dielectric material may also be employed in the embodiments of FIGS. 7A and 7B and the embodiments of the remaining examples of FIGS. 7C–7K.

In the embodiment of FIGS. 7C and 7D, conductors 56 are located on the opposite side of substrate 52 opposite to that of facing conductor 58. In the embodiment of FIG. 7E sidewalls 80' have a tapered width which is greater as sidewalls 80' approach conductor 58. In the embodiment of FIG. 7F sidewalls 80" are tapered so as to have a greater width as they approach conductors 56.

The embodiment of FIG. 7G is similar to the embodiment of FIG. 7C except that sidewalls 80' in FIG. 7G replace sidewalls 80 of FIG. 7C. In the embodiment of FIG. 7H sidewalls 82 replace the sidewalls 80 of FIG. 7B, and comprise conductive material instead of dielectric material.

The embodiment of FIG. 7I is substantially similar to the embodiment of FIG. 4 except sidewalls 84 are partially tapered. The embodiment of FIG. 7J is similar to the embodiment of FIG. 7H except sidewalls 82, are tapered. The embodiment of FIG. 7K is substantially similar to the embodiment of FIG. 7I except conductors 56 are located o the side of substrate 52 opposite to that facing conductor 58.

Figure 6:
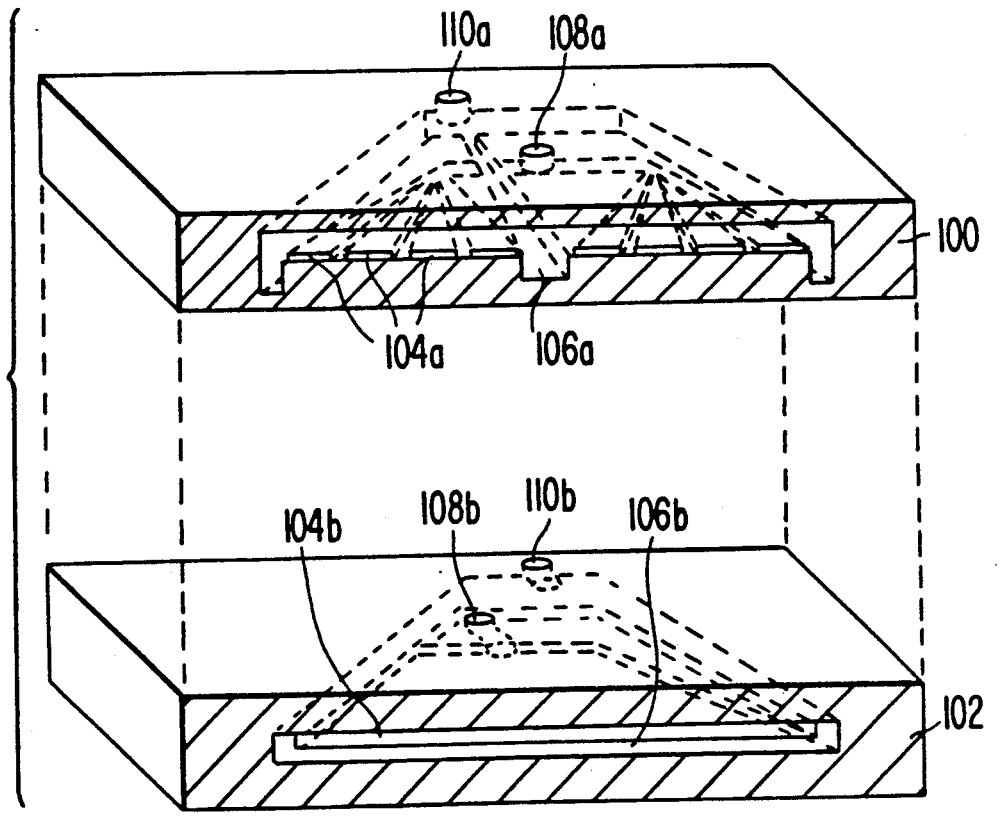
FIG. 6 is a diagram of extrusion molds used to produce the ribbon cable of FIG. 3.

As was noted above, the preferred embodiment of FIGS. 3 and 4 may be manufactured employing a selective two plastic extrusion technique. Such a technique is disclosed in Canadian Patent No. 1,255,810, the contents of which are hereby expressly incorporated by reference. Referring to FIG. 6, molds 100 and 102 are employed consistent with this technique. Molds 100 and 102 have in them first mold cavities 104a and 104b which are positioned to correspond to the location of first conductors 56 and second conductor 58, respectively. Molds 100 and 102 have second mold cavities 106a and 106b which correspond in shape and location to substrate 52 and cover 54, respectively. Dielectric material is inserted into intake ports 108a and 108b, respectively, which is treated to be receptive to metallic plating. For example, a palladium catalyst may be dispersed on a powdered aluminum silicate clay and added into a polymer to obtain a dielectric material receptive to plating. A dielectric material which is not receptive to metallic plating is introduced into mold cavities 106a and 106b through input ports 110a and 110b, respectively. Examples of such dielectric material are styrene, polycarbonate, polyether sulfone and poly phenylene sulfide.

As a consequence of the foregoing, molds 100 and 102 are used to co-extrude an elongated base of flexible dielectric material which is not receptive to plating through mold cavities 106a and 106b and a plurality of strips of flexible dielectric material receptive to plating located parallel to one another in a surface of the first dielectric material to form a continuous pattern longitudinally along the resultant base which corresponds to the intended location of first conductors 56. These plurality of strips of dielectric material are shown in FIG. 4 as strips 120. As noted before, the material comprising strips 120 is designed to be receptive to metallic plating. Accordingly, in a subsequent step strips of conductive material are plated on resultant base 52 to form first conductors 56.

A similar co-extruding process is employed to construct cover 54 which comprises a first dielectric material formed through mold cavity 106 of mold 102 in FIG. 6 and a strip of second dielectric material which is receptive to metallic plating formed through mold cavity 104b of mold 102. The second dielectric material forms a strip 122 as shown in FIG. 4 commensurate with the intended location of conductor 58. Conductor 58 is subsequently formed by plating copper or other suitable conductive substance on cover 54.

After the co-extrusion process is complete, cover 54 is mounted to base 52 using conventional techniques, such as a snap interconnect.

Additional methodolgies may be used to construct a tunnel multiconductor system in accordance with the teachings of the subject invention. For example, the substrate and cover may be constructed using molding techniques or using standard extrusion techniques. As another alternative example, channels or grooves may be cut in a substrate or base and conductors, corresponding to conductors 56, may be located in the resultant channels or grooves. Laser writing techniques may be employed to generate the grooves or channels. Imaging and plating techniques may be employed to place conductors 56 and 58 in the corresponding substrates and covers. Conductive links or epoxies may also be employed to provide the requisite conductors.

The connectors assembled to each end of the resultant ribbon cable may comprise conventional pin connectors as mentioned above, or in the alternative may comprise some form of pressure contact such as metallic springs. In any event, a very high speed low loss multiconductor interconnect system results which can replace conventional ribbon cables of the prior art.

The teachings of the subject invention are also applicable to interconnect multiport terminals on printed circuit boards such as modules, circuit packs, backplanes, sideplanes, and mother boards. Such printed circuit boards typically comprise glass reinforced epoxy laminate, such as FR4 or polyimide materials. They may be in the form of laminates or molded circuit boards. One example of a conventional circuit board arrangement is shown in FIG. 8.

Figure 8:
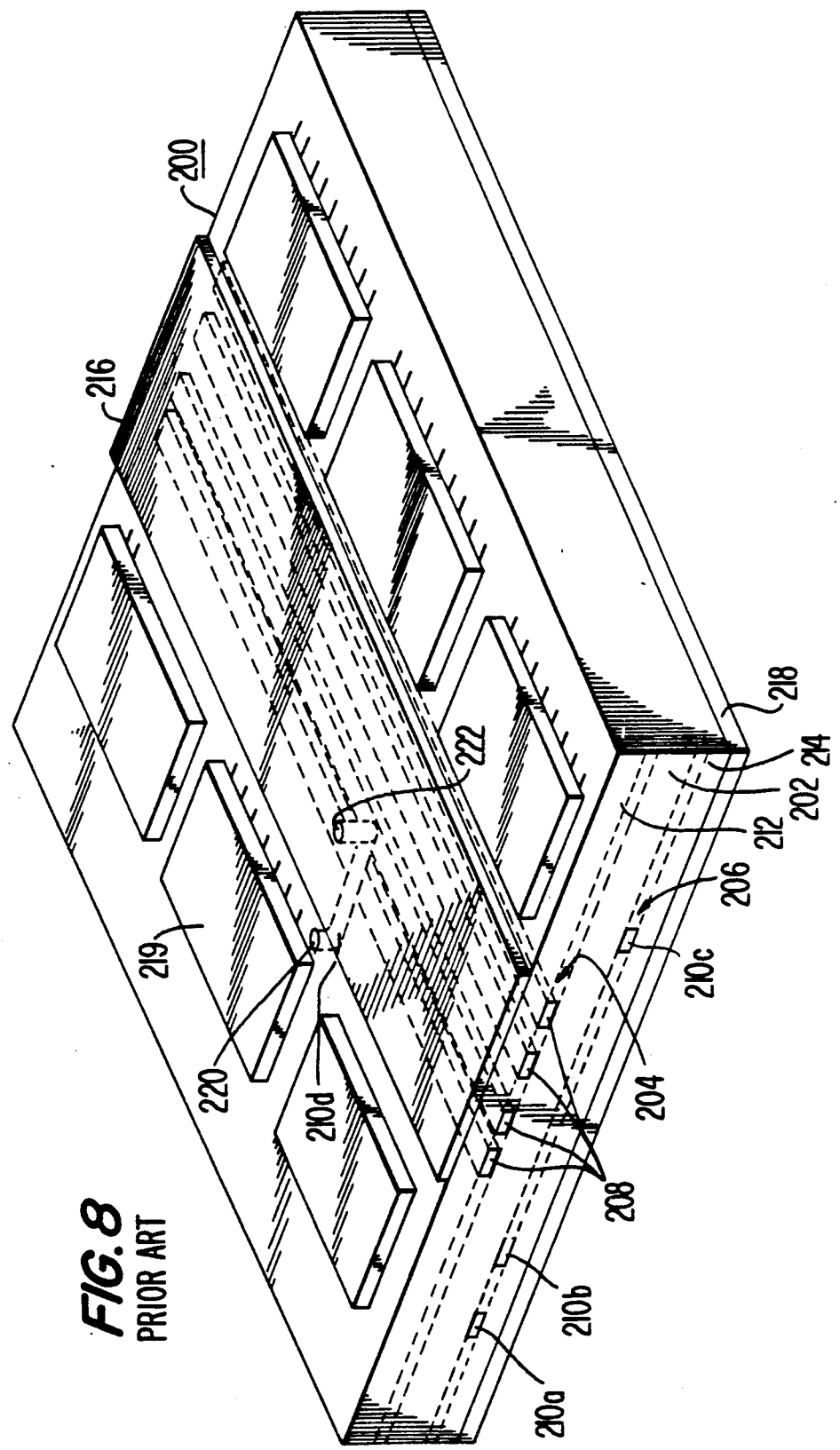
FIG. 8 is a diagram of a conventional printed circuit board interconnect system.

In FIG. 8 a circuit board 200 is shown which comprises a central core layer 202 of dielectric material on either side of which is mounted through conventional techniques circuit patterns 204 and 206. Circuit pattern 204 as shown in FIG. 8 comprises a series of high speed conductors 208, whereas circuit pattern 206 comprises a plurality of individual conductors 210A, B, C and D which may assume any necessary interconnect pattern.

Circuit board 200 further comprises dielectric layers 212 and 214 which are laminated using conventional techniques on circuit patterns 204 and 206, respectively. A ground plane 216 is shown plated on the outer surface of dielectric layer 212 and a ground plane 218 is shown plated on the exposed surface of dielectric layer 214.

A plurality of chips 219 are shown mounted on the exposed surface of dielectric layer 212. Using conventional techniques, via holes 220 and 222 in combination with conductor 210D permit connection of a particular terminal of chip 219 with a particular conductor 208.

Figure 9:
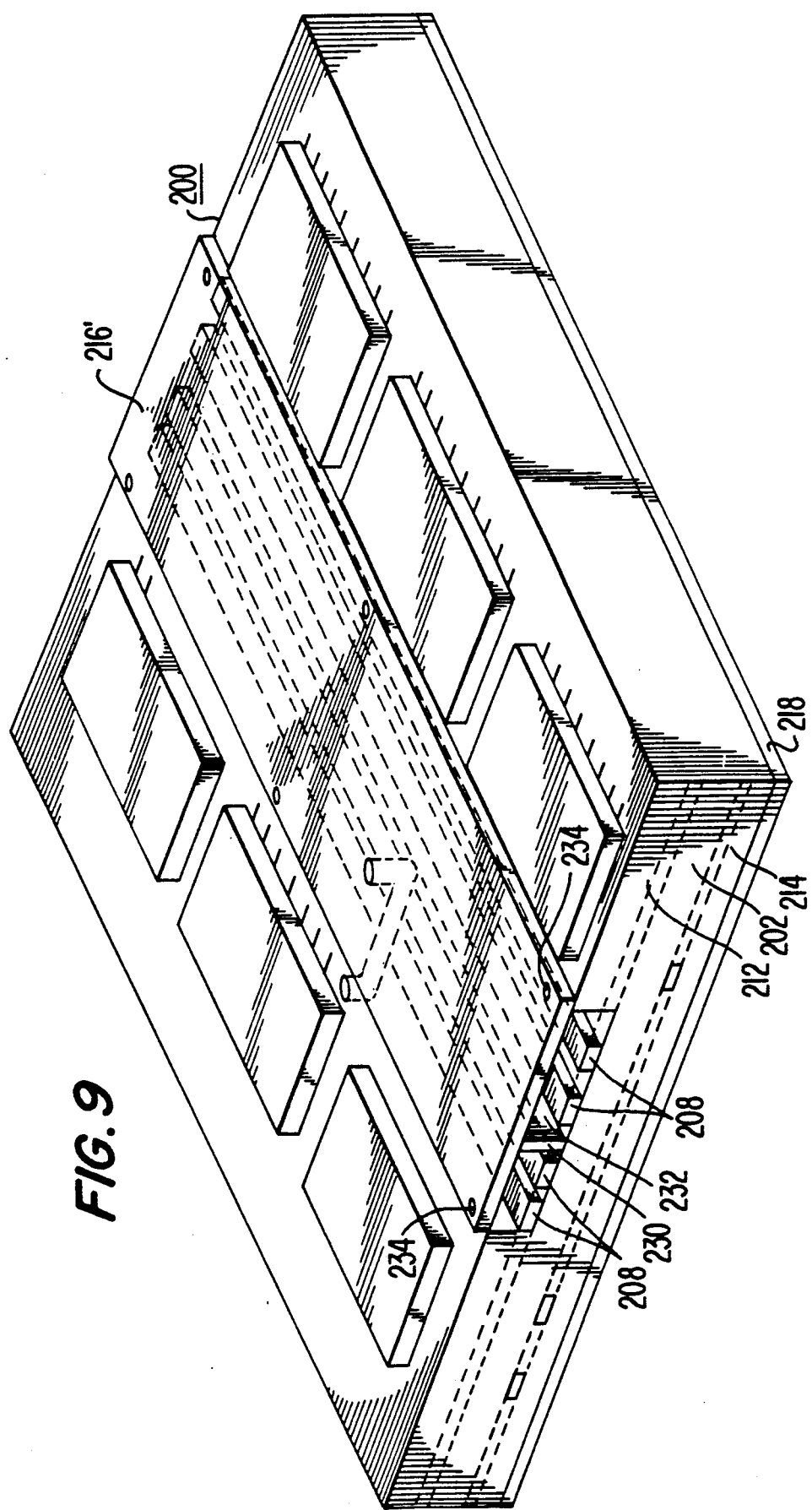
FIG. 9 is a diagram of a tunnel multiconductor system applied to a printed circuit board.

In the embodiment of FIG. 9, ground plane 216' is separated from dielectric layer 202 by the combination of dielectric layer 212 and support wall 230. That portion of dielectric 212 located under ground plane 216 has been removed to permit formation of a tunnel 232 in which conductors 208 are located. As a consequence of this structure, the transmission speed of conductors 208 is increased over that shown in the embodiment of FIG. 8.

A summary of the steps employed to construct the structure of FIG. 9 follows:

1. Raw materials—A standard FR4 of polyimide can be used which comprises central dielectric layer 208 and a complete copper plating on either side thereof.

2. Via hole formation—Via holes are drilled through the starting raw material extending from one plated side to the other at locations where resultant conductors on one side need to be connected to resultant conductors on the other. Conventional procedures may be used.

3. Via hole filling—Standard electroless/electrolytic plate procedure is used wherein the via holes formed in step 2 are coated and then filled with conducting material.

4. Form conductive patterns on both sides of core dielectric—Traditional print/etch interconnecting conductor techniques are employed to develop the appropriate circuit pattern on either side of the core layer 202. This pattern includes high speed conductors 208 and should include a one-quarter inch relief area at the periphery of conductors 208 so as to permit formation of tunnel 232. The relief area allows ease of removal of protective materials used at a later stage to form tunnel 232.

5. Protect tunnel area—The area in which tunnel 232 is formed is first covered by a high temperature adhesive tape followed by coverage with PTFE cloth. This technique may, for example, be of the nature developed by Ferranti Computer Systems of the United Kingdom for a different application. The adhesive tape ensures encapsulation of the conductors, and the PTFE cloth ensures nonadhesion of the bonding materials during lamination.

6. Laminate dielectric materials 212 and 214—Using conventional techniques layers 212 and 214 are formed. Care should be taken to ensure that the masking materials do not extend outside the tunnel relief area thereby inhibiting the formation of layers of 212 and 214. These external layers should be bonded using standard techniques.

7. Via hole formation—To the extent via holes are required from the external surfaces of layers 212 and 214 to the internal conductors, such holes should be formed through conventional drilling techniques. These holes should not be formed in the area in which tunnel 232 is to be created.

8. Coat and fill the newly formed via holes using standard procedures.

9. Print patterns on the external surfaces of layers 212 and 214 using conventional techniques. A layer corresponding to reference plane 216 should not be formed at this time.

10. Use an etching technique to complete formation of the external patterns on the surfaces of layers 212 and 214. As illustrated in FIG. 9, for example, a reference plane 218 is formed on the external surface of layer 214.

11. Form tunnel—Depth profile to expose tunnel area 232 using, for example, an excimer laser depth route on the top surface of layer 212. Remove laminate, PTFE, and adhesive tape. Clean surfaces to remove residue. The material above the tunnel area is prevented from adhering to layer 202 by the masking materials (adhesive tape and PTFE cloth). By profiling around the outside edge (the area of tunnel 232) the materials can be removed to expose the underlying conductors 208.

12. Reflow finish—Use hot air or oil reflow with corresponding protection of tunnel area.

13. Mount reference plane—attach metallized reference plane over tunnel area 332 using conventional techniques such as screws 234 or glue. Support area 230 should be physically attached to reference plane 216, prior to mounting. Support 230 may, for example, be metallic or nonmetallic in configuration.

Figure 10:
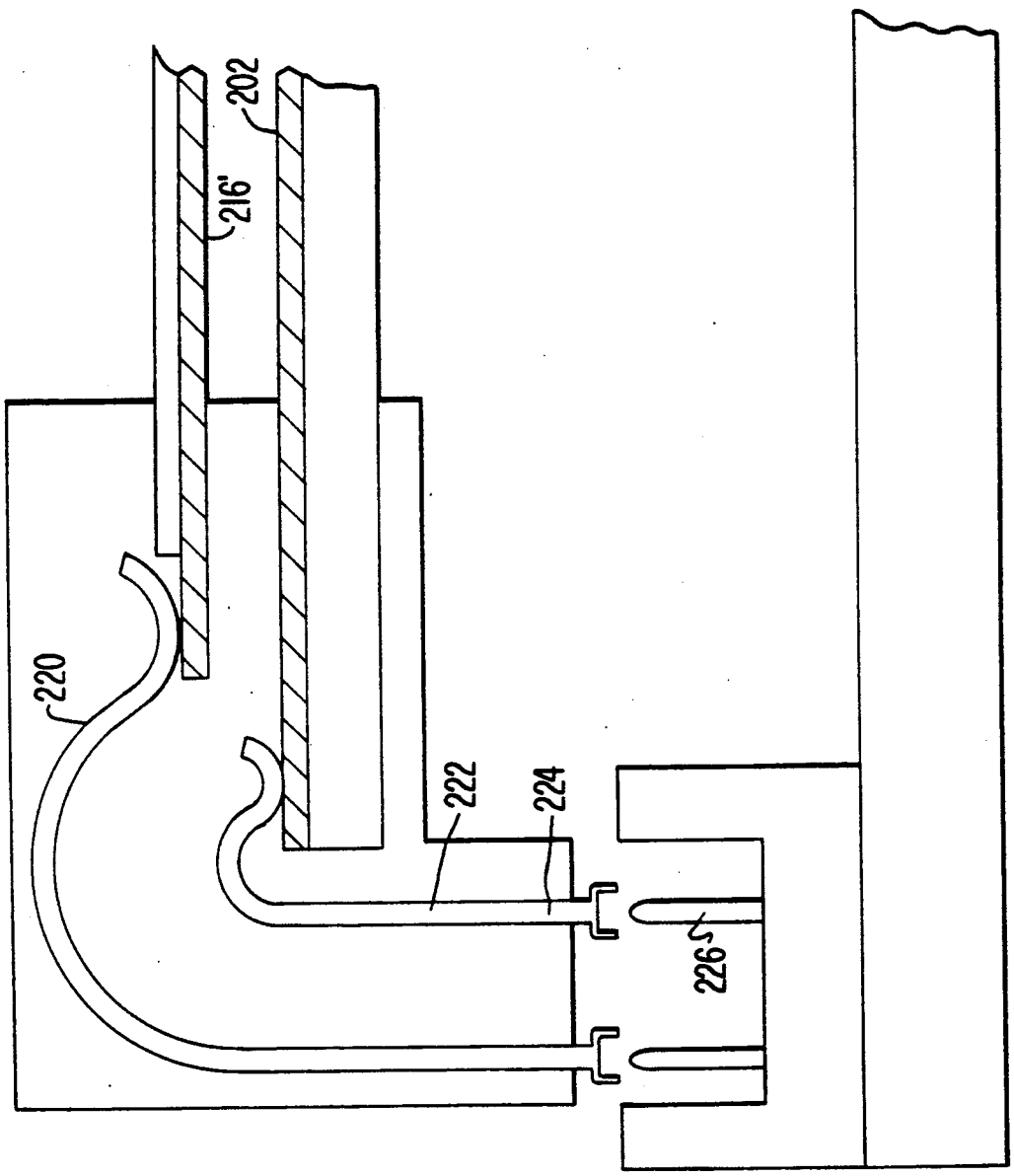
FIGS. 10, 11 and 12 are side-view illustrations of connectors which may be used with the multiconductor system of the present invention.
Figure 11:
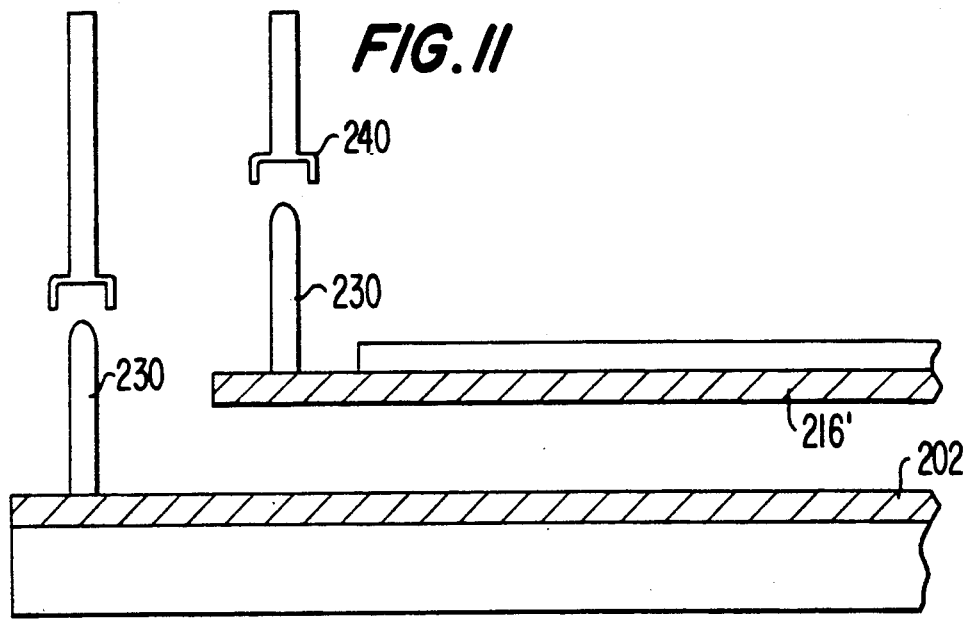
Figure 12:
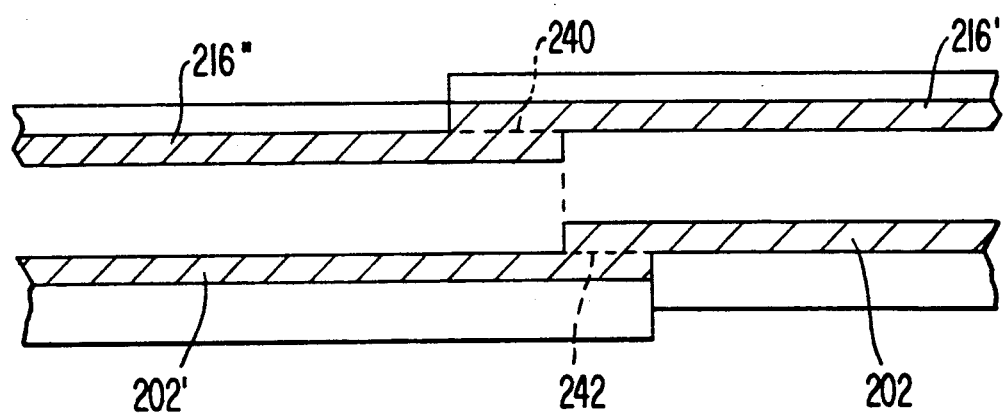

FIGS. 10, 11 and 12 show various methods of connecting conductors 216' and ground plane 202 to corresponding external multiport terminals. For example, in FIG. 10, conductors 216' and ground plane 202 are physically contacted by corresponding springs 220 and 222 which in turn are connected at their distal ends 224 to traditional pin interconnects 226. In FIG. 11 conventional pins 230 are physically mounted to conductors 216' and 202 with corresponding sockets 240 used for interconnection purposes. In FIG. 12 conductors 216' and 202 are connected to corresponding conductors 216" and 202' by use of butt joints 240.

Additional advantages and modifications will readily occur to those skilled in the art. The invention in its broader aspect is, therefore, not limited to the specific details, representative apparatus and illustrative examples shown and described. Accordingly, departures may be made from such details without departing from the spirit or scope of applicants' general inventive concept.

We claim:

1. A tunnel multiconductor system for connecting a multiport terminal of one electrical subassembly to a multiport terminal of another electrical subassembly, comprising:
   a substrate of dielectric material;
   N first conductors, with N greater than 2, supported by said substrate to form a multiconductor pattern;
   a second conductor shaped to act as a ground plane for said multiconductor pattern;
   means for positioning said second conductor in spaced relation to said multiconductor pattern to form a tunnel which may be gas filled between said second conductor and said first conductors, and wherein said second conductor forms a ground plane for said first conductors; and
   means, located at each end of said first conductors, for coupling said first conductors and said second conductor to respective multiport terminals of said electrical subassemblies.

2. The system of claim 1 wherein said substrate, said first conductors, and said second conductors are flexible.

3. The system of claim 1 wherein said first conductors lie outside said tunnel.

4. The system of claim 2 wherein said first conductors lie inside said tunnel.

5. The system of claim 4 wherein said substrate, said first conductors and said second conductor are elongated and said first conductors lie side by side parallel to one another to form a ribbon interconnect.

6. The system as in any one of claims 1-5 wherein said tunnel is filled with air.

7. The system as in any one of claims 1-5 wherein said tunnel is filled with an inert gas.

8. The system as in any one of claims 1-5 wherein said means for positioning forms multiple tunnels.

9. The system of claim 8 wherein at least three of said first conductors are located in each tunnel.

10. The system of claim 8 wherein only one first conductor is located in each tunnel.

11. The system as in any one of claims 1-5 wherein said substrate is formed of extruded material.

12. The system of claim 11 wherein said means for positioning is also formed of extruded material and is snapped together with said extruded material forming said substrate.

13. The system of claim 1 wherein said substrate comprises a printed circuit board.

14. The system of claim 1 wherein said means for positioning is formed of conductive material.

15. The system of claim 1 wherein said means for positioning is formed of dielectric material.

* * * * *